United States Patent [19]

Blech et al.

[11] Patent Number: 4,882,611

[45] Date of Patent: Nov. 21, 1989

[54] DOUBLE LAYER VOLTAGE-PROGRAMMABLE DEVICE AND METHOD OF MANUFACTURING SAME

[75] Inventors: Ilan A. Blech, Sunnyvale; Levy Gerzberg, Pala Alto, all of Calif.; Yosef Y. Shacham, Haifa, Israel; Alexander Sinar, Cupertino; Eric R. Sirkin, Palo Alto, both of Calif.

[73] Assignee: Zoran Corporation, Santa Clara, Calif.

[21] Appl. No.: 222,653

[22] Filed: Jul. 21, 1988

[51] Int. Cl.[4] .................... H01L 45/00; H01L 27/02; H01L 29/34

[52] U.S. Cl. .......................................... 357/51; 357/2; 357/54; 365/94; 365/100

[58] Field of Search ................. 357/51, 2, 54; 365/94, 365/96, 100

[56] References Cited

U.S. PATENT DOCUMENTS

| | | | |
|---|---|---|---|
| 4,543,594 | 9/1985 | Mohsen et al. | 357/51 |
| 4,569,120 | 2/1986 | Staeef et al. | 357/51 |
| 4,684,972 | 8/1987 | Owen et al. | 357/2 |

FOREIGN PATENT DOCUMENTS 02500078 12/1987 European Pat. Off. ............. 357/52

OTHER PUBLICATIONS

S. M. Sze, *Semiconductor Reviews Physics and Technology*, John Wiley & Sons, New York (2985) p. 362.

*Primary Examiner*—J. Carroll
*Attorney, Agent, or Firm*—Flehr, Hohbach, Test Albritton & Herbert

[57] ABSTRACT

A voltage-programmable device in which the programming voltage $V_p$ and the "off" resistance $R_i$ are separately controlled. The device includes a body of semiconductor material having a doped region therein, and an amorphized layer in the doped region and abutting a surface, and a surface layer in the amorphized layer with the surface layer having a resistivity higher than the resistivity of the amorphized layer prior ot programming of the device. The surface layer has a miniscule thickness (on the order of 50–150 Angstroms) and does not affect the programming of the device. Moreover, the final resistance of the programmed device is not significantly affected by the presence of the first layer. The amorphized layer is formed by ion implantation, and the or by oxygen plasma treatment.

6 Claims, 1 Drawing Sheet

DOUBLE LAYER VOLTAGE-PROGRAMMABLE DEVICE AND METHOD OF MANUFACTURING SAME

BACKGROUND

This invention relates generally to semiconductor devices and semiconductor processing, and more particularly the invention relates to a voltage-programmable device and method of manufacturing same.

Disclosed in Gerzberg U.S. Pat. No. 4,590,589 is an electrically-programmable device in which a surface region of a doped semiconductor region is amorphized by ion implantation to thereby increase the resistance of the surface layer. The resistance can be significantly reduced by applying a sufficient programming voltage to the surface layer to partially crystallize the amorphous layer of the surface layer.

The control of the programming voltage ($V_p$) and "off" resistance ($R_i$) is realized by adjusting the parameters of the implant, namely the acceleration voltage ($V_{acc}$). A reduced $V_{acc}$ will result in lower $V_p$ and lower $R_i$ since both of these parameters are related to the thickness of the amorphized layer. The present invention is directed to providing separate control over the $V_p$ and $R_i$ parameters of the electrically programmable device.

SUMMARY OF THE INVENTION

Accordingly, an object of the present invention is a method of fabricating a voltage-programmable device of the described type in which $V_p$ and $R_i$ are separately controlled.

Another object of the invention is a voltage-programmable device of the described type which has a reduced $V_p$ while maintaining a high $R_i$.

A feature of the invention is the provision of two high-resistance layers which serially define the total $R_i$ of the device.

Briefly, in accordance with the invention, an amorphized layer is formed in the contact area of a voltage-programmable device as taught in Gerzberg U.S. Pat. No. 4,590,589. Thereafter, a second, thin, high-resistance layer is formed on the surface of the amorphized layer. The resistance of the second layer dominates the device resistance in the high resistance state. However, because of the miniscule thickness of the second layer (i.e. on the order of 50-150 Å), the second layer does not affect the programming and conduction of the device. A voltage drop of 2-5 volts across the second layer is sufficient to cause breakdown of the layer. Further, the final resistance of the programmed device is not significantly affected by the presence of the second layer after breakdown.

The invention and objects and features thereof will be more readily apparent from the following detailed description and appended claims when taken with the drawing.

DETAILED DESCRIPTION OF ILLUSTRATIVE EMBODIMENT

Figure 1A:
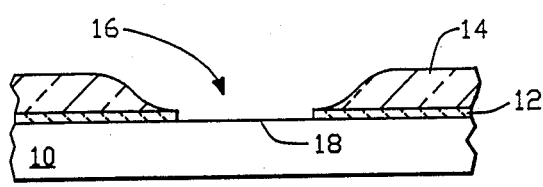
FIGS. 1A-1C are section views of a portion of a semiconductor structure illustrating the fabrication of a voltage-programmable device in accordance with the prior art.
Figure 1B:
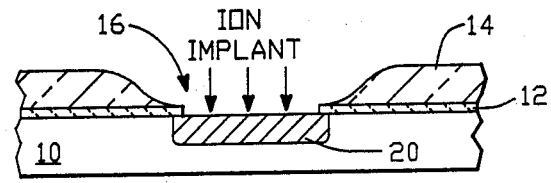
Figure 1C:
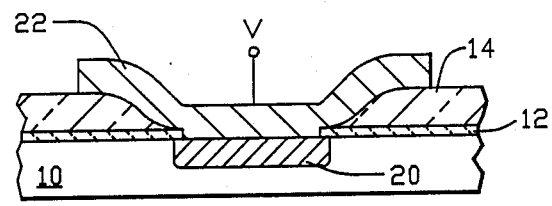

Referring now to the drawing, FIGS. 1A-1C are section views of a semiconductor body illustrating the steps of fabricating a voltage-programmable device in accordance with the Gerzberg U.S. Pat. No. 4,590,589.

In FIG. 1A a semiconductor 10 substrate is doped to provide a desired low resistance conduction path. The semiconductor body may be polycrystalline or single crystalline silicon, for example, and a silicon oxide layer 12 is formed on one surface thereof. A second layer of silicon oxide 14, for example field oxide, may be provided on the silicon oxide layer 12. By conventional photoresist masking and chemical etching techniques a window shown generally at 16 is formed through the silicon oxide layers thereby exposing a limited surface 18 of the substrate 10.

In FIG. 1B ions are directed through the window 16 and implanted in surface region 20 abutting the exposed surface area 18. Any species that causes amorphization of silicon can be used for this step, specifically argon, arsenic, silicon and antimony atoms. The depth of the implanted ions is readily controlled by voltage of the ion source. As is well known in the art, the implantation of ions in a semiconductor body disrupts the crystalline structure of the silicon thereby increasing the electrical resistance thereof. In one embodiment argon ions are implanted at an energy of 60 kev and a dose of $1.0 \times 10^{16}$ ions cm$^{-2}$ into a single crystalline silicon substrate having a dopant concentration of $10^{21}$ atoms cm$^{-3}$ and the resulting resistance of the contact to the implanted region was $8 \times 10^7$ ohms as compared to the 50 ohms resistance of the contact to the substrate. As shown in FIG. 1C, a metal contact 22 of sputtered aluminum-silicon, titanium-tungsten, or a metal silicide, for example, is formed over the oxide layer 14 and in contact with the surface 18 of substrate 10.

By restricting the operating voltage applied to the contact 22, the resistance of the surface region 20 remains at $8 \times 10^7$ ohms. However, by increasing the voltage applied to contact 22, breakdown occurs so the surface region 20 can be heated sufficiently to reduce the relatively high resistance thereof. In the embodiment described above, the normal operating voltage of 5 volts will not affect the $8 \times 10^7$ ohm resistance of the surface region 20. However, by increasing the voltage to 12 volts, the resistance of the contact to the surface region 20 is reduced to 500-2000 ohms depending on programming circuitry. Accordingly, a very high-resistance structure can be converted to a low-resistance conductor by selectively applying a voltage thereacross which generates sufficient heat to create a polycrystalline filament in the amorphous layer structure of the surface region.

As noted above, the control of the programming voltage $V_p$ and the "off" resistance $R_i$ is realized by but not restricted to adjusting the parameters of the implant, mainly the acceleration voltage, $V_{acc}$.

FIGS. 2A-2D are section views of a semiconductor body illustrating steps in fabricating a programmable device in accordance with one embodiment of the present invention and in which separate control over the programming voltage $V_p$ and the "off" resistance $R_i$ is achieved. The structure is similar to the structure of FIGS. 1A-1C, and like elements have the same reference numerals.

Figure 2A:
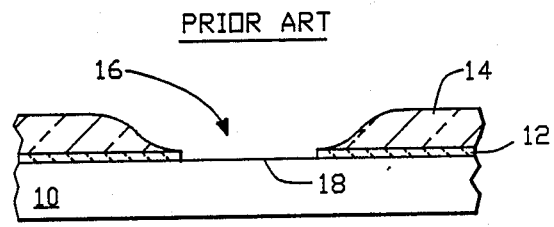
FIGS. 2A-2D are section views of a portion of a semiconductor structure illustrating the fabrication of a voltage-programmable device in accordance with the invention.
Figure 2B:
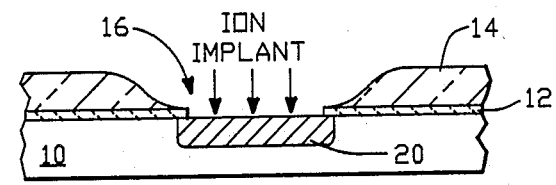
Figure 2C:
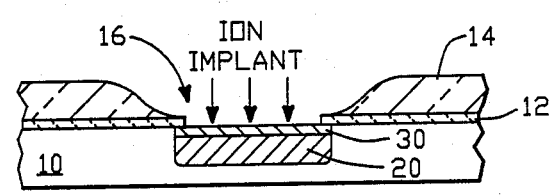
Figure 2D:
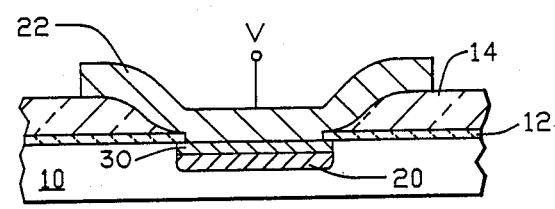

Steps of FIGS. 2A and 2B are identical to the steps of FIGS. 1A and 1B. However, in accordance with the invention, a second ion implant is provided in the surface layer 20, thereby forming a second, thin, high-resistance layer 30 in the surface of the region 20. The thin layer 30 has a very high resistance and dominates the device resistance in the unprogrammed state. However, because of its miniscule thickness (on the order of 50-150 Å), the thin layer 30 does not affect the programming of the device for the "on" resistance of the device after programming.

In one example the thin layer 30 is produced by ion beam nitridization of the amorphized region 20, single ionized nitrogen (N+) ions are implanted with an acceleration voltage $V_{acc}$ of 1.7 kev and the total dose being $5.0 \times 10^{16}$ per square centimeter. Alternatively, the surface layer 30 can be formed using oxygen plasma. In one example the plasma pressure is 1 torr, the power being 300 watts and the duration of treatment being 15 minutes.

Thereafter, as illustrated in FIG. 2E, the device is completed by the deposition of titanium-tungsten as in FIG. 1C.

The following is a table comparing the conventional voltage-programmable device of the Gerzberg patent with a double-layer device using the nitrogen ion implantation and using the oxygen plasma:

TABLE 1

| Device Parameter | Conventional Device | Device With Nitrogen Ion Implantation | Device With Oxyzen Plasma |
| --- | --- | --- | --- |
| Low field conductivity (ohm × cm)$^{-1}$ | $10^{-5}$-$10^{-6}$ | $10^{-9}$-$10^{-10}$ | $10^{-7}$-$10^{-8}$ |
| Programming voltage $V_p$ volt | 10.0 ± 0.55 | 14.5 ± 0.75 | 11.0 ± 0.5 |
| Programming (snap) current mA | 0.5-1.0 | 0.01-0.5 | 0.05-0.5 |
| Initial resistance @ 2 V MOhms | 3.0-15 | 1000-5000 | 500-2000 |
| Initial resistance @ 5 V MOhms | 0.5-2 | 20-100 | 25-75 |

A double layer voltage-programmable device in accordance with the invention achieves the objectives of separate control over the programming voltage $V_p$ and the "off" resistance $R_i$. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A non-erasable voltage-programmable semiconductor device comprising
   a semiconductor material having a doped region therein of one conductivity type,
   an amorphized layer of said one conductivity type in said doped region abutting a surface, and
   a surface layer on said amorphized layer, said surface layer having a resistivity higher than the resistivity of said amorphized layer prior to programming of said device and a permanently lower resistivity after programming.

2. The device as defined by claim 1 wherein said amorphized layer is formed by a first ion implantation in said doped region, and said surface layer is formed by a second ion implantation in said amorphized layer.

3. The device as defined by claim 1 wherein said amorphized layer is formed by a first ion implantation, and said surface layer is formed by treating said amorphized layer with an oxygen plasma.

4. The device as defined by claim 1 wherein the thickness of said surface layer is on the order of 50 Å-150 Å.

5. The device as defined by claim 4 and further including a contact to said surface layer.

6. The device as defined by claim 1 and further including a contact to said surface layer.

* * * * *